(12) United States Patent
Kashiwaya (10) Patent No.: US 9,455,396 B2
(45) Date of Patent: Sep. 27, 2016

(54) PIEZOELECTRIC/ELECTROSTRICTIVE ELEMENT AND WIRING SUBSTRATE
(71) Applicant: NGK Insulators, Ltd., Nagoya (JP)
(72) Inventor: Toshikatsu Kashiwaya, Inazawa (JP)
(73) Assignee: NGK Insulators, Ltd., Nagoya (JP)
( * ) Notice: Subject to any disclaimer, the term of this patent is extended or adjusted under 35 U.S.C. 154(b) by 338 days.
(21) Appl. No.: 14/224,507
(22) Filed: Mar. 25, 2014
(65) Prior Publication Data
US 2014/0292156 A1 Oct. 2, 2014
(30) Foreign Application Priority Data
Mar. 26, 2013 (JP) .................. 2013-063483
(51) Int. Cl.
*H01L 41/047* (2006.01)
*H01L 21/48* (2006.01)
*C04B 41/90* (2006.01)
*C04B 41/00* (2006.01)
(Continued)
(52) U.S. Cl.
CPC ........... *H01L 41/047* (2013.01); *C04B 41/009* (2013.01); *C04B 41/52* (2013.01); *C04B 41/90* (2013.01); *H01L 21/4846* (2013.01); *H01L 41/0477* (2013.01); *C04B 2111/00844* (2013.01); *H01L 41/29* (2013.01); *H01L 2924/0002* (2013.01)
(58) Field of Classification Search
CPC ............... H01L 41/0477; H01L 41/29; H01L 2924/0002; H01L 2924/00; H01L 21/4846; C04B 41/009; C04B 41/52; C04B 41/4535; C04B 41/5049
USPC ............................... 310/311–371; 252/0.9 PZ
See application file for complete search history.

(56) References Cited

U.S. PATENT DOCUMENTS 4,795,512 A 1/1989 Nakatani et al.
2005/0046312 A1* 3/2005 Miyoshi .............. H01L 41/1477
310/366

(Continued)

FOREIGN PATENT DOCUMENTS

JP H05-298918 11/1993
JP H05-298919 11/1993

(Continued)

OTHER PUBLICATIONS

Extended European Search Report (Application No. 14161599.7) dated Aug. 26, 2014.

(Continued)

*Primary Examiner* — Thomas Dougherty
*Assistant Examiner* — Karen B Addison
(74) *Attorney, Agent, or Firm* — Burr & Brown, PLLC (57) ABSTRACT

A piezoelectric/electrostrictive element includes a substrate, an adhesive layer, a first conductive layer, an anchor portion and a second conductive layer. The substrate contains a ceramic as a main component. The substrate has a main surface. The adhesive layer is formed on the main surface of the substrate. The adhesive layer contains a metal oxide as a main component. The first conductive layer is formed on the adhesive layer. The anchor portion is formed on the adhesive layer. The anchor portion is embedded in the conductive layer. The anchor portion contains glass as a main component. The second conductive layer is disposed opposite to the first conductive layer with the substrate located in-between.

8 Claims, 7 Drawing Sheets (51) Int. Cl.
*C04B 41/52* (2006.01)
*C04B 111/00* (2006.01)
*H01L 41/29* (2013.01)

(56) References Cited

U.S. PATENT DOCUMENTS

2005/0233112 A1 10/2005 Loh et al.
2012/0225197 A1 9/2012 Ebigase

FOREIGN PATENT DOCUMENTS

JP 2004-087378 A1 3/2004
JP 2012-182288 A 9/2012

OTHER PUBLICATIONS

Japanese Office Action, Japanese Application No. 2013-063483, dated Apr. 14, 2015 (4 pages).

* cited by examiner

PIEZOELECTRIC/ELECTROSTRICTIVE ELEMENT AND WIRING SUBSTRATE

CROSS-REFERENCE TO RELATED APPLICATIONS

This application claims priority under 35 U.S.C. §119 to Japanese Patent Application No. 2013-063483, filed on Mar. 26, 2013. The entire disclosure of Japanese Patent Application No. 2013-063483 is hereby incorporated herein by reference.

BACKGROUND

1. Technical Field

The technology disclosed herein relates to a piezoelectric/electrostrictive element and a wiring substrate provided with a ceramic substrate and a conductive layer.

2. Background Information

Japanese Patent Application Laid-Open No. 2004-87378 discloses an organic metallic composition containing an organic gold compounds, and organic rhodium, organic bismuth and organic zinc in a predetermined ratio.

The organic metallic composition enhances film formation characteristics when forming a conductive layer on the surface of a glass-based substrate

SUMMARY

However, when a conductive layer is formed on a ceramic substrate by use of the organic metal composition in Japanese Patent Application Laid-Open No. 2004-87378, the conductive layer exhibits a tendency to peel due to the low adhesion of the conductive layer to the ceramic substrate.

In light of the problems in the conventional techniques as described above, the object of the technology disclosed herein is to provide a piezoelectric/electrostrictive element and a wiring substrate that enhances the adhesion of the conductive layer to the ceramic substrate.

A piezoelectric/electrostrictive element according to the technology disclosed herein includes a substrate, an adhesive layer, a first conductive layer, an anchor portion and a second conductive layer. The substrate contains a ceramic as a main component. The substrate has a main surface. The adhesive layer is formed on the main surface of the substrate. The adhesive layer contains a metal oxide as a main component. The first conductive layer is formed on the adhesive layer. The anchor portion is formed on the adhesive layer. The anchor portion is embedded in the conductive layer. The anchor portion contains glass as a main component. The second conductive layer is disposed opposite to the first conductive layer with the substrate located in-between.

The piezoelectric/electrostrictive element and wiring substrate according to the technology disclosed herein enhances the adhesion of a conductive layer to a ceramic substrate.

BRIEF DESCRIPTION OF DRAWINGS

Referring now to the attached drawings which form a part of this original disclosure.

DETAILED DESCRIPTION OF EMBODIMENTS

Next, a piezoelectric/electrostrictive element configured with an electrode structure will be described making reference to the drawings. The piezoelectric/electrostrictive element can be used for example in an inkjet head actuator, a gyro sensor, an oscillator, an injector actuator, or the like.

The same or similar portions disclosed in the following figures are denoted by the same or similar reference numerals. However, the figures are merely schematic, and the ratios of the respective dimensions or the like may differ from the actual values. Therefore, the actual dimensions or the like should be determined by making reference to the following description. In addition, it is naturally the case that portions are included that exhibit differences in relation to ratios or in relation to the relationship between mutual dimensions in different figures.

Configuration of Piezoelectric/electrostrictive Element 100

Figure 1:
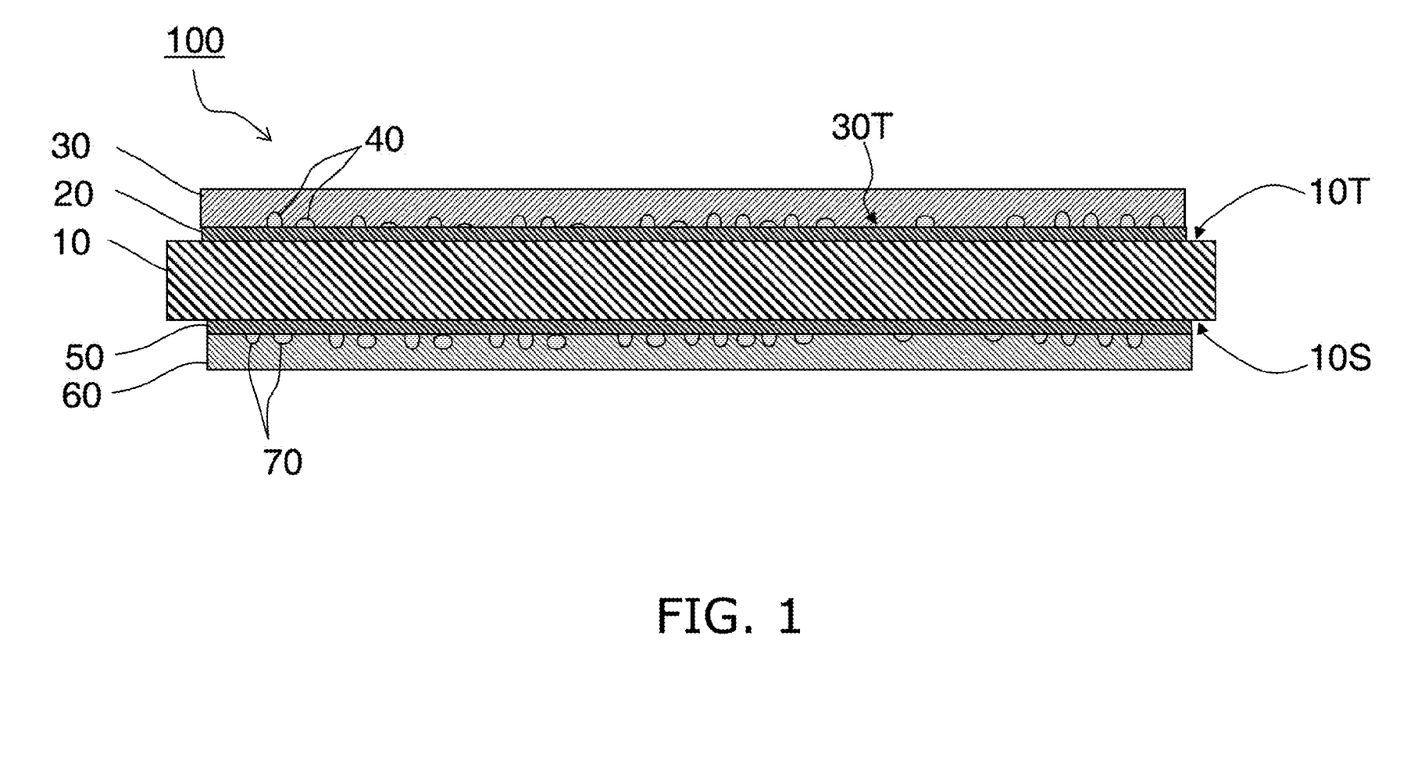
FIG. 1 is a sectional view of a configuration of a piezoelectric/electrostrictive element.
Figure 2:
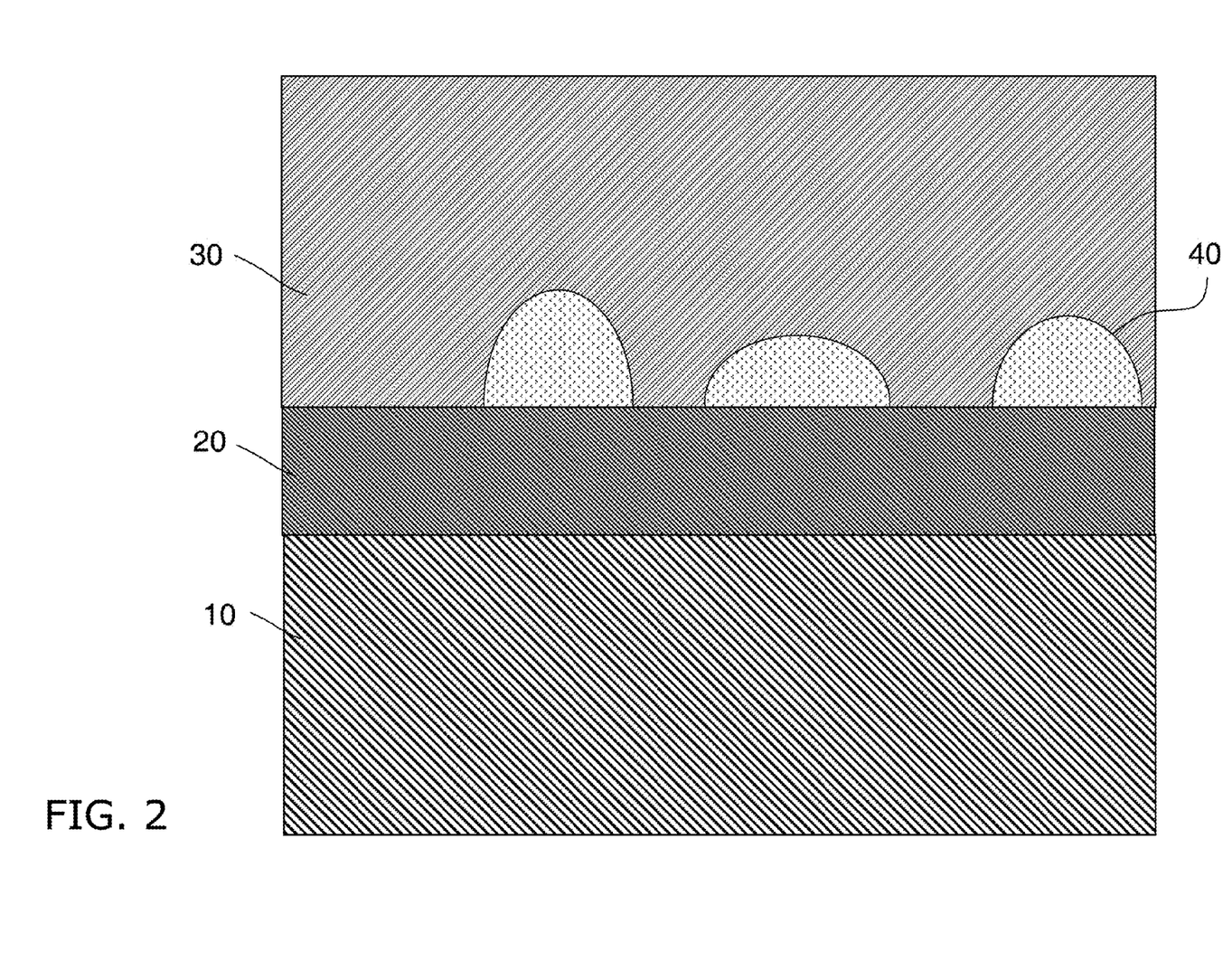
FIG. 2 is a partial enlargement of FIG. 1.

The configuration of a piezoelectric/electrostrictive element 100 will be described making reference to the figures. FIG. 1 is a sectional view of a configuration of a piezoelectric/electrostrictive element. FIG. 2 is a partial enlargement of FIG. 1.

The piezoelectric/electrostrictive element 100 includes a piezoelectric body 10, a first adhesive layer 20, a first conductive layer 30, a plurality of first anchor portions 40, a second adhesive layer 50, a second conductive layer 60, and a plurality of second anchor portions 70.

The piezoelectric body 10 is disposed between the first conductive layer 30 and the second conductive layer 60. The piezoelectric body 10 is formed in a tabular configuration, and includes a first main surface 10S and a second main surface 10T. The first adhesive layer 20 is formed on the first main surface 10S, and a second conductive layer 50 is disposed on the second main surface 10T. The thickness of the piezoelectric body 10 is from 3 microns to 500 microns.

The piezoelectric body 10 includes a conventional piezoelectric ceramic material as a main component. In addition to a lead-based piezoelectric ceramic, the piezoelectric ceramic includes barium titanate, bismuth sodium titanate, sodium potassium niobate, strontium bismuth tantalite, or the like. A lead based ceramic includes for example lead zirconate titanate (PZT), lead zirconate, lead titanate, lead-magnesium niobate, lead nickel niobate, lead zinc niobate, lead manganese niobate, lead antimony stanate, lead manganese tungstate, lead cobalt niobate, or the like.

In particular, when the first adhesive layer 20 and the second adhesive layer 50 contain bismuth (Bi) and lead (Pb), the piezoelectric body 10 preferably contains a lead-based piezoelectric ceramic that exhibits superior reactivity with Bi or Pb as a main component. In the present embodiment, the disclosure that composition X "contains" substance Y "as a main component" means that substance Y occupies preferably at least 60 wt %, more preferably at least 70 wt %, still more preferably at least 90 wt % of the overall composition X.

The piezoelectric body 10 may include at least one additive such as lanthanum, calcium, strontium, molybdenum, tungsten, barium, niobium, zinc, nickel, manganese, cerium, cadmium, chrome, cobalt, antimony, iron, iridium, tantalum, lithium, bismuth, and tin. The coercive electric field or the piezoelectric characteristics can be adjusted by addition of lanthanum or strontium to the lead-based piezoelectric ceramic.

The first adhesive layer 20 is formed on the first main surface 10S of the piezoelectric body 10. The first adhesive layer 20 is sandwiched between the piezoelectric body 10 and the first conductive layer 30. The thickness of the first adhesive layer 20 is 2 nm to 200 nm, and more preferably 5 nm to 100 nm.

The first adhesive layer 20 preferably covers substantially the whole surface of the adhesive surface 30S of the first conductive layer 30 that adheres to the piezoelectric body 10. However, a localized space may be formed in the first adhesive layer 20, and the piezoelectric body 10 and the first conductive layer 30 may be configured to make direct contact in that space. The coverage of the adhesive surface 30S by the first adhesive layer 20 is preferably at least 90%.

The first adhesive layer 20 contains a metal oxide as a main component. The metal oxide contained in the first adhesive layer 20 includes at least one of bismuth oxide, lead oxide and vanadium oxide. The metal oxide is preferably chemically bonded to the ceramic contained in the piezoelectric body 10. In this manner, the adhesion of the first adhesive layer 20 to the piezoelectric body 10 is enhanced.

The first adhesive layer 20 may be crystalline. That is to say, the particles that configure the first adhesive layer 20 may be configured in a repetitive regular array.

The first conductive layer 30 is formed on the first adhesive layer 20. The first conductive layer 30 is disposed opposite to the second conductive layer 60 with the piezoelectric body 10 located in-between. The first conductive layer 30 functions as an electrode for the piezoelectric/electrostrictive element 100. The thickness of the first conductive layer 30 is 50 nm to 5 microns.

The first conductive layer 30 contains a conventionally used electrode material as a main component. The electrode material includes at least one of gold (Au), silver (Ag), copper (Cu), and platinum (Pt), or an alloy thereof. There is no particular limitation in relation to the planar shape of the first conductive layer 30, and a configuration in a rectangular, comb shape, round shape, or the like is possible.

The first anchor portion 40 is formed on the first adhesive layer 20, and is embedded into the first conductive layer 30. The first anchor portion 40 may be positioned at a triple junction of the crystal grain of the first conductive layer 30.

The sectional shape of the first anchor portion 40 may be semi oval, semicircular, or wedge shaped. However, deep embedding into an inner portion of the first conductive layer 30 is preferred. The depth of embedding of the first anchor portion 40 may be 5 nm to 50 nm. The anchoring effect of the first anchor portion 40 enables the first conductive layer 30 to adhere to the first adhesive layer 20.

The first anchor portion 40 contains glass as a main component. The glass preferably includes boron oxide ($B_2O_3$) and silicon oxide ($SiO_2$). Examples of that glass include $SiO_2$—$B_2O_3$—$ZnO$ based glass, $SiO_2$—$B_2O_3$—$Na_2O$ based glass, $SiO_2$—$B_2O_3$—$K_2O$ based glass and $SiO_2$—$B_2O_3$—$Al_2O_3$ based glass. The glass that is contained in the first anchor portion 40 is preferably chemically bonded with the metal oxide that is included in the first adhesive layer 20. In this manner, the adhesion of the first anchor portion 40 to the first adhesive layer 20 can be enhanced.

The ratio (hereinafter referred to as "weight concentration ratio") of the Si concentration (wt %) to the B concentration (weight %) in the first anchor portion 40 is preferably at least 2.5.

The second adhesive layer 50 is formed on the second main surface 10T of the piezoelectric body 10. The second adhesive layer 50 exhibits the same configuration as the first adhesive layer 20. The second adhesive layer 50 contains the metal oxide that configures the first adhesive layer 20 as a main component.

The second conductive layer 60 is formed on the second adhesive layer 50. The second conductive layer 60 is disposed opposite to the first conductive layer 30 with the piezoelectric body 10 located in-between. The second conductive layer 60 functions as an electrode of the piezoelectric/electrostrictive element 100. The main component of the second conductive layer 60 is the electrode material used to configure the first conductive layer 30.

The second anchor portion 70 is formed on the second adhesive layer 50, and is embedded into the second conductive layer 60. The main component of the second anchor portion 70 is the glass that configures the first anchor portion 40.

Method of Manufacturing Piezoelectric/Electrostrictive Element 100

Next, the method of manufacturing the piezoelectric/electrostrictive element 100 will be described.

Firstly, a green sheet that includes a piezoelectric ceramic powder, a carrier, a dispersant and a plasticizing agent is heated and degreased at a predetermined temperature.

Next, the green sheet is placed into an electric furnace and fired under predetermined conditions (900 degrees C. to 1300 degrees C., 1 hour to 10 hours) to thereby manufacture the piezoelectric body 10.

Next, an organic metal compound paste is manufactured by dissolving an organic metal compound of each constituent element in an organic solvent to thereby obtain the glass of the first anchor portion 40, the electrode material of the first conductive layer 30 and the metallic oxide of the first adhesive layer 20 at a predetermined ratio. In the same manner, an organic metal compound paste is manufactured by dissolving an organic metal compound of each constituent element in an organic solvent to thereby obtain the glass of the second anchor portion 70, the electrode material of the second conductive layer 60 and the metal oxide of the second adhesive layer 50 at a predetermined ratio.

Next, a screen printing method, a spin coating method, a spray coating method, or the like is used to coat the organic metal compound paste onto the first and the second main surfaces 10S, 10T of the piezoelectric body 10. If required, the paste may be patterned by use of a photolithography method or the like. The patterning may be performed after firing of the organic metallic compound.

Next, the paste of the organic metallic compound is fired under predetermined conditions (550 degrees C. to 900 degrees C., 0.1 hour to 1 hour) to thereby form the first adhesive layer 20, the first conductive layer 30 and the first anchor layer 40 on the first main surface 10S side of the piezoelectric body 10, and the second adhesive layer 50, the second conductive layer 60 and the second anchor layer 70 on the second main surface 10T side of the piezoelectric body 10.

Operation and Effect

The piezoelectric/electrostrictive element 100 includes the piezoelectric body 10 (example of a substrate), a first adhesive layer 20 (example of an adhesive layer), a first conductive layer 30 (example of a conductive layer) and a first anchor portion 40 (example of an anchor portion). The piezoelectric body 10 contains a ceramic as a main component. The first adhesive layer 20 is formed on the first main surface 10S (example of a main surface) of the piezoelectric body 10 and contains a metal oxide as a main component. The first conductive layer 30 is formed on the first adhesive layer 20. The first anchor portion 40 is formed on the first adhesive layer 20 and is embedded into the first conductive layer 30. The first anchor portion 40 contains glass as a main component.

Therefore, the first anchor portion 40 adheres to the first adhesive layer 20, and the first adhesive layer adheres to the piezoelectric body 10. The first conductive layer 30 adheres to the first adhesive layer 20 due to the anchoring effect of the first anchor portion 40. In this manner, the adhesion of the first conductive layer 30 to the piezoelectric body 10 can be enhanced through the first adhesive layer 20 and the first anchor layer 40.

Other Embodiments

The present invention is not limited to the above embodiments and may be changed or varied in various ways within a scope that does not depart from the spirit of the invention.

For example, in the above embodiment, although the piezoelectric/electrostrictive element 100 includes the second adhesive layer 50 and the second anchor portion 70, the piezoelectric/electrostrictive element 100 may be configured without the second adhesive layer 50 and the second anchor portion 70. In this configuration, the second conductive layer 60 may be formed on the second main surface 10T of the piezoelectric body 10.

In the above embodiment, the adhesive layer 20 was formed naturally between the piezoelectric body 10 and the first conductive layer 30 by firing the organic metallic compound paste that includes the constituent elements of the adhesive layer 20. However, the invention is not thereby limited. For example, the adhesive layer 20 can be formed by a sputtering method or the like that uses a target that includes the constituent elements of the adhesive layer 20.

In the above embodiments, although a configuration was described in which the electrode structure according to the present invention was applied to the piezoelectric/electrostrictive element 100, the invention is not thereby limited. The electrode structure according to the present invention can also be applied to a wiring substrate that includes electrical wiring (an example of a conductive layer) formed on a ceramic substrate. In this configuration, the electrical wiring may include the first adhesive layer 20 and the first conductive layer 30. This type of wiring substrate includes a printed substrate in which printed wiring is formed on a ceramic substrate. The ceramic substrate may be configured by a material other than a piezoelectric ceramic material (for example, an yttria-stabilized zirconia (YSZ).

EXAMPLES

Although the example of the present invention will be described hereafter, the invention is not thereby limited to the description of those examples.

Preparation of Samples No. 1 and No. 3 to 20

Samples No. 1 and No. 3 to 20 are prepared as shown below.

Firstly, a green sheet is prepared by using a slurry formed by mixing a carrier, a dispersant and a plasticizer with a ceramic. As shown in Table 1, sample No. 1, No. 3 to 14, and No. 16 to 20 use PZT, and sample No. 15 uses YSZ ($ZrO_2$-6 wt %$Y_2O_3$).

Next, the green sheet is placed in an electric oven and samples No. 1, No. 3 to 14, and No. 16 to 20 are fired for two hours at 1200 degrees C., and sample No. 15 is fired for two hours at 1400 degrees C. to thereby prepare a substrate.

Next, an organic metal compound paste is prepared by dissolving the organic metal compound at the ratio shown in Table 1 in an organic solvent.

Next, screen printing is used to coat the organic metal compound paste onto a first main surface of a substrate.

Figure 3:
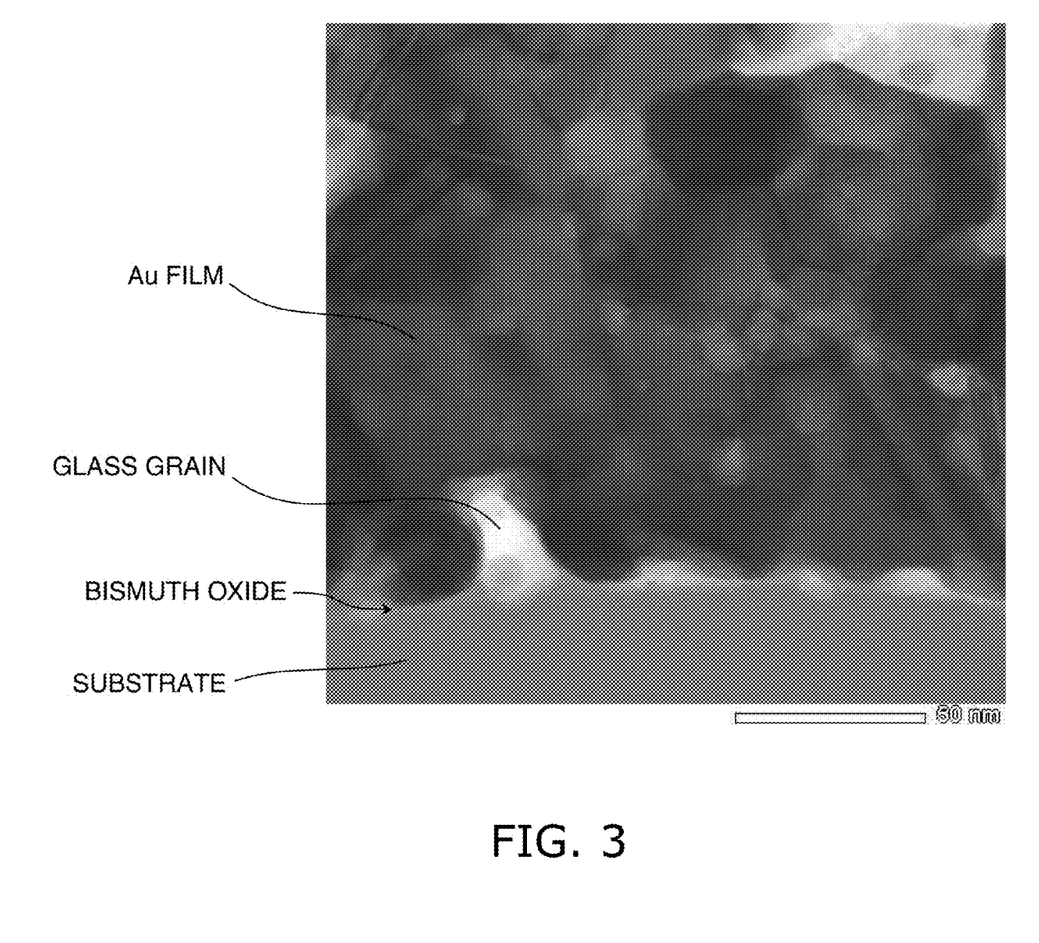
FIG. 3 is a SEM image of a cross section of an example.

Next, a conductive layer is formed by firing the organic metal compound paste for 10 minutes at 700 degrees C. In this manner, as shown by the sectional SEM image in FIG. 3, samples No. 1, and No. 3 to 18 form an Au film and an adhesive layer (bismuth oxide, vanadium oxide), and borosilicate glass grains that are embedded into the Au film. On the other hand, sample No. 19 does not form an adhesive layer, and sample No. 20 does not form glass grains.

As shown in Table 1, the thickness of the adhesive layer correlates with the added amount of Bi or V.

Preparation of Sample No. 2

Sample No. 2 is prepared as described below.

Firstly, a substrate is prepared in the same manner as for samples No. 1, and No. 3 to 20 described above.

Next, a sputtering method is used to form a $Bi_2O_3$ film having a thickness of 10 nm on a main surface of the substrate as an adhesive layer.

Next, an organic metal compound paste is prepared by dissolving the organic metal compound at the ratio shown in Table 1 in an organic solvent.

Next, screen printing is used to coat the organic metal compound paste onto the $Bi_2O_3$ film.

Next, the organic metal compound paste is fired for 10 minutes at 700 degrees C. to form the conductive layer and glass grains on the $Bi_2O_3$ film.

Peeling due to Scratch Testing

The Au film surface of each sample is scratched using a needle point and the scratch is confirmed by use of an optical microscope. The peeling conditions of the Au film are summarized in Table 1.

Figure 4:
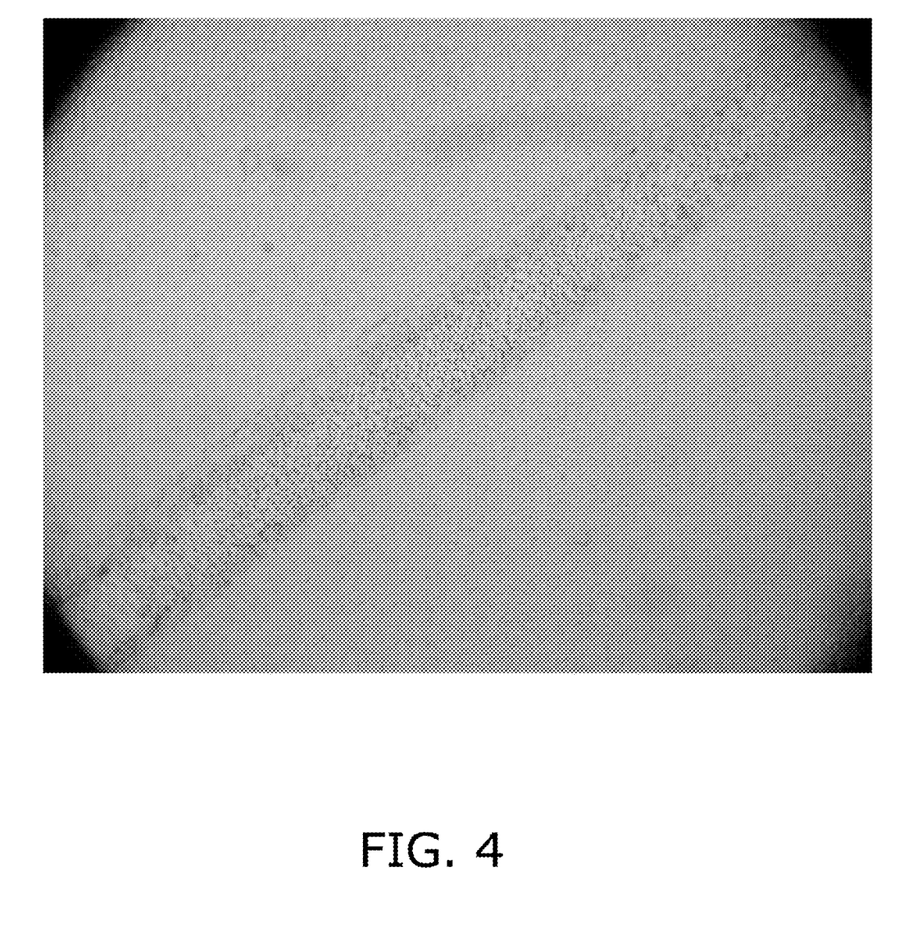
FIG. 4 is an optical photomicrograph illustrating a surface of sample No. 3 after a scratch test.
Figure 5:
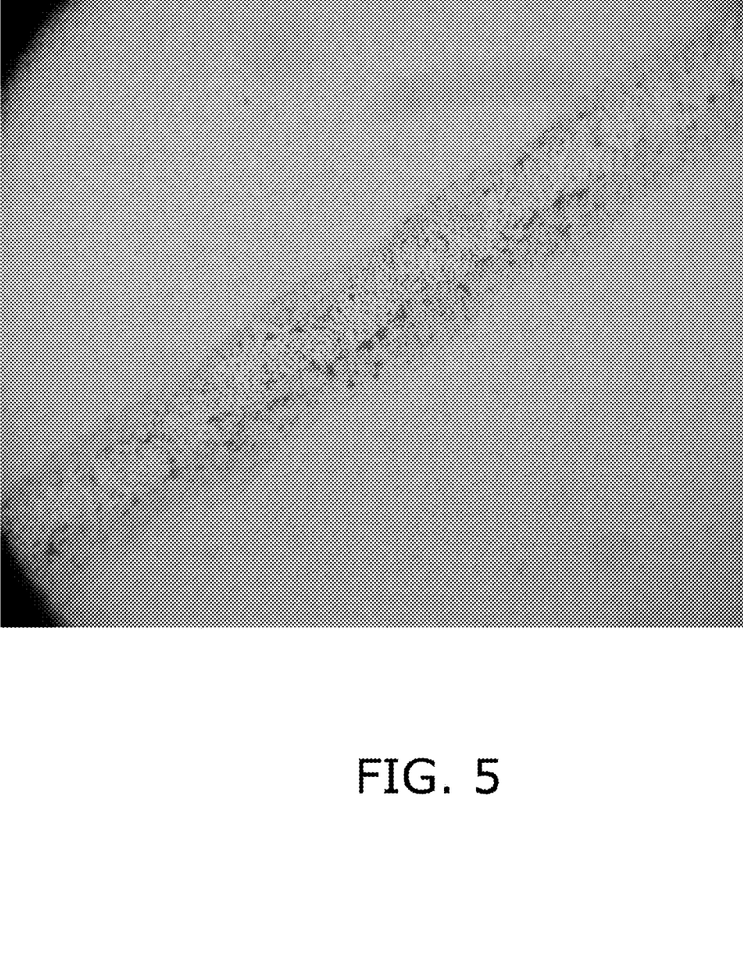
FIG. 5 is an optical photomicrograph illustrating a surface of sample No. 4 after a scratch test.
Figure 6:
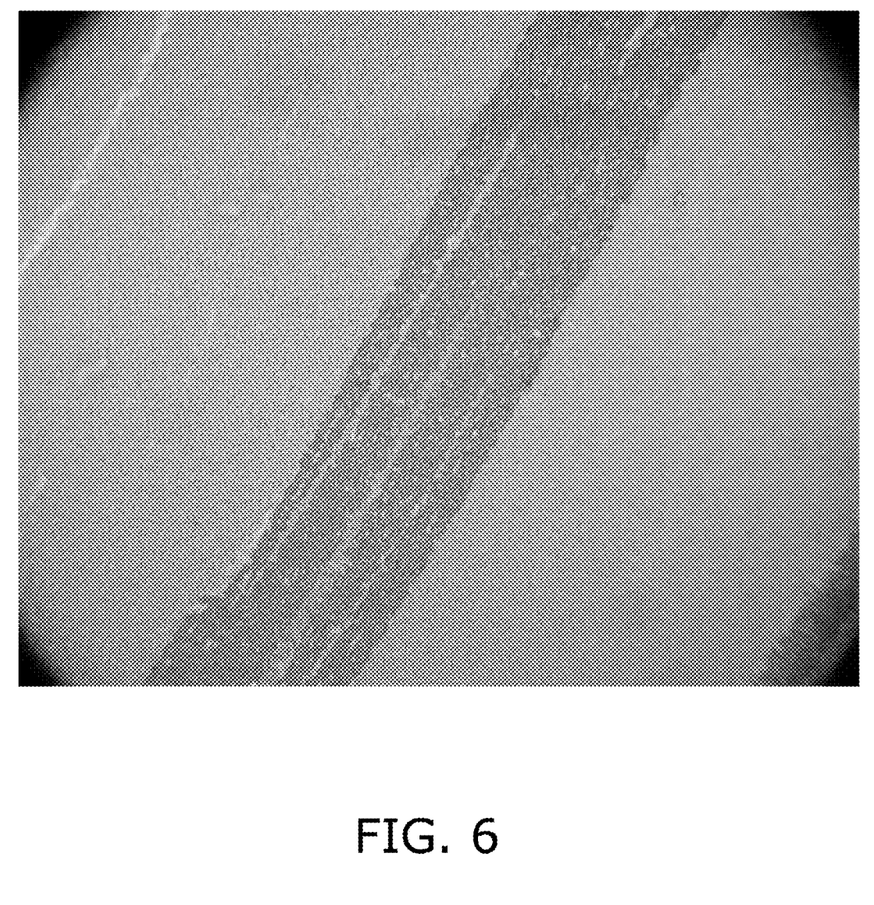
FIG. 6 is an optical photomicrograph illustrating a surface of sample No. 19 after a scratch test.
Figure 7:
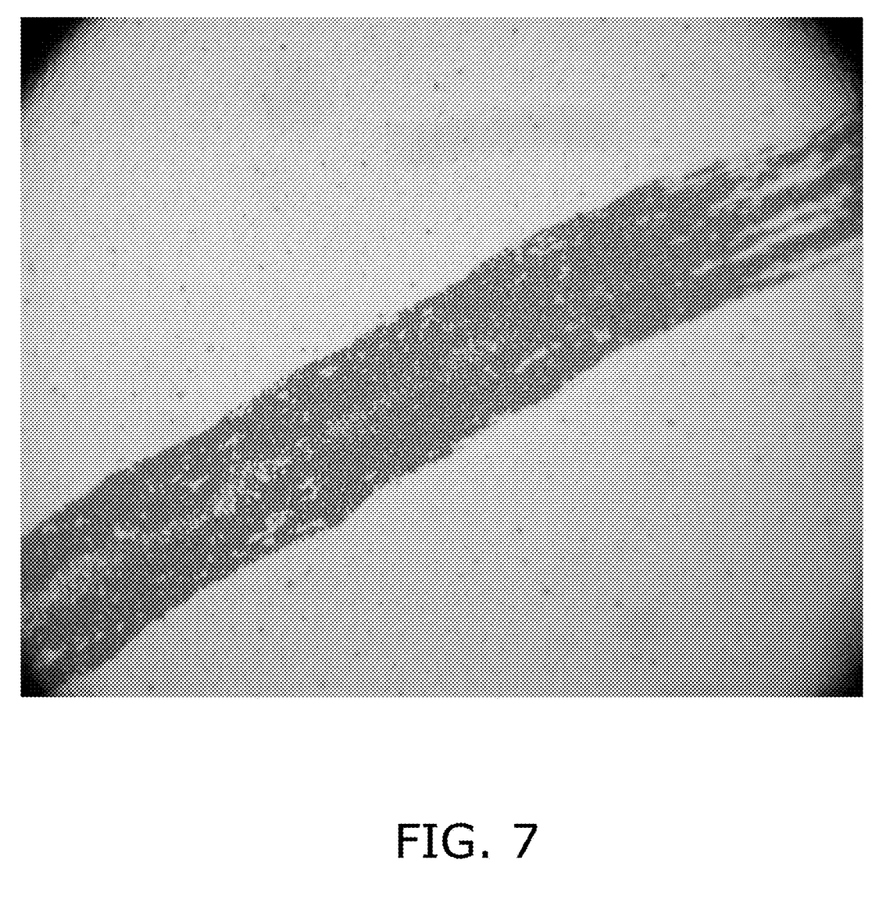
FIG. 7 is an optical photomicrograph illustrating a surface of sample No. 20 after a scratch test.

FIG. 4 is an optical photomicrograph illustrating a scratch on sample No. 3. FIG. 5 is an optical photomicrograph illustrating a scratch on sample No. 4. FIG. 6 is an optical photomicrograph illustrating a scratch on sample No. 19. FIG. 7 is an optical photomicrograph illustrating a scratch on sample No. 20. These optical photomicrographs illustrate the peeling position on the Au film as a black colored region in the scratch that is drawn with a slope.

TABLE 1

| Sample No. | Ceramic | Organic Metal Compound (wt % Conversion of Element Component) | | | | | | Si/B Weight Concentration Ratio | Thickness of Adhesive Layer (nm) | Peeling due to Scratch Test |
| --- | --- | --- | --- | --- | --- | --- | --- | --- | --- | --- |
| | | Au | Rh | Bi | V | Si | B | | | |
| 1 | PZT | 20 | 0.06 | 0.5 | — | 0.04 | 0.024 | 1.6 | 10 | Little |
| 2 | PZT | 20 | 0.06 | — | — | 0.04 | 0.024 | 1.6 | 10 | Little |

TABLE 1-continued

| Sample No. | Ceramic | Organic Metal Compound (wt % Conversion of Element Component) | | | | | | Si/B Weight Concentration Ratio | Thickness of Adhesive Layer (nm) | Peeling due to Scratch Test |
| --- | --- | --- | --- | --- | --- | --- | --- | --- | --- | --- |
| | | Au | Rh | Bi | V | Si | B | | | |
| 3 | PZT | 20 | 0.06 | 0.5 | — | 0.06 | 0.024 | 2.5 | 10 | Almost none |
| 4 | PZT | 20 | 0.06 | 0.5 | — | 0.06 | 0.036 | 1.6 | 10 | Little |
| 5 | PZT | 20 | 0.06 | 0.5 | — | 0.12 | 0.048 | 2.5 | 10 | Almost none |
| 6 | PZT | 20 | 0.06 | 0.5 | — | 0.12 | 0.072 | 1.6 | 10 | Little |
| 7 | PZT | 20 | 0.06 | 0.1 | — | 0.06 | 0.024 | 2.5 | 2 | Partial peeling |
| 8 | PZT | 20 | 0.06 | 0.2 | — | 0.06 | 0.024 | 2.5 | 4 | Partial peeling |
| 9 | PZT | 20 | 0.06 | 1 | — | 0.06 | 0.024 | 2.5 | 25 | Almost none |
| 10 | PZT | 20 | 0.06 | 1.5 | — | 0.06 | 0.024 | 2.5 | 100 | Little |
| 11 | PZT | 20 | 0.06 | 2 | — | 0.06 | 0.024 | 2.5 | 200 | Partial peeling |
| 12 | PZT | 20 | 0.06 | 2 | — | 0.04 | 0.048 | 0.8 | 200 | Partial peeling |
| 13 | PZT | 20 | 0.06 | 0.5 | — | 0.04 | 0.024 | 1.6 | 10 | Little |
| 14 | PZT | 20 | 0.06 | — | 0.5 | 0.04 | 0.024 | 1.6 | 10 | Partial peeling |
| 15 | YSZ | 20 | 0.06 | 0.5 | — | 0.04 | 0.024 | 1.6 | 10 | Little |
| 16 | PZT | 20 | 0.06 | 0.3 | — | 0.04 | 0.024 | 1.6 | 6 | Partial peeling |
| 17 | PZT | 20 | 0.06 | 0.5 | — | 0.02 | 0.012 | 1.6 | 10 | Partial peeling |
| 18 | PZT | 20 | 0.06 | 0.5 | — | 0.01 | 0.006 | 1.6 | 10 | Partial peeling |
| 19 | PZT | 20 | 0.06 | — | — | 0.04 | 0.024 | 0.16 | — | Complete peeling |
| 20 | PZT | 20 | 0.06 | 0.5 | — | — | — | — | 10 | Complete peeling |

As shown by Table 1 and FIG. 4 to FIG. 7, samples No. 1 to No. 18 form glass grains and an adhesive layer (bismuth oxide and vanadium oxide) between the Au film and the ceramic substrate (PZT substrate, YSZ substrate). In those samples, the peeling resulting from the scratch testing was suppressed. This feature is due to the fact that the respective adhesive layers and the glass grains and the ceramic substrate adhere through a chemical bond in addition to the fact that the Au film and the adhesive layer adhere as a result of the anchoring effect of the glass grains to thereby enhance the adhesive properties with the Au film.

Sample No. 3 in FIG. 4 exhibits almost no peeling of the Au film. In contrast, sample No. 4 in FIG. 4 exhibits greater Au film peeling than sample No. 3. This feature is due to the fact that the hardness of the glass grains is maintained during firing as a result of the increase in the silicon ratio and therefore the glass grains are deeply embedded into the Au film. Therefore, it can be shown that the weight concentration ratio of the silicon to boron is preferably at least 2.5.

The scratch testing of sample No. 1 and sample No. 2 both obtained a good result. Therefore, the adhesion of the Au film is shown to be enhanced irrespective of the method of formation of the adhesive layer.

In the scratch testing of sample No. 13 and sample No. 14, sample No. 13 exhibits the superior result. This feature is thought to result from the greater increase in the adhesion between bismuth oxide and PZT when compared to vanadium oxide. Therefore, the adhesion of bismuth oxide on a substrate of a lead-based bismuth compound is shown to be superior.

The scratch testing of sample No. 13 and sample No. 15 both obtained a good result. Therefore, the adhesion of the Au film is shown to be enhanced irrespective of the material of the substrate.

Since a superior result is also obtained in the scratch testing of sample No. 17 and sample No. 18, the number of glass grains is shown to enable at least sufficient enhancement of the adhesion of the Au film.

In the scratch testing of sample No. 1 and sample No. 16, sample No. 1 exhibits the superior result. From this fact, it is shown that the adhesion of the Au film can be further enhanced by a configuration in the thickness of the adhesion layer (bismuth oxide) of at least 10 nm.

In the scratch testing of sample No. 10 and sample No. 11, sample No. 10 exhibits the superior result. This feature is thought to be due to the fact that the adhesive layer is overly thick in sample No. 11, and that the adhesive layer itself was damaged during the scratch test. Consequently, it is shown that the adhesion of the Au film can be further enhanced by limiting the adhesive layer (bismuth oxide) to a thickness of no more than 100 nm.

Although not shown in Table 1, the coverage of the Au film by the adhesion layer (bismuth oxide) was measured using a sectional TEM image of sample No. 1 and sample No. 16. More specifically, the ratio covered by bismuth oxide of the substrate side surface of the Au film is calculated as the coverage. As result, the coverage of sample No. 1 is 91%, whereas the coverage of sample No. 16 is 78%. When the results of coverage are collated with those for the scratch test, it is shown that the adhesion of the Au film can be enhanced as the coverage increases.

What is claimed is:

1. A piezoelectric/electrostrictive element comprising,
   a substrate containing ceramic as a main component, the substrate having a main surface;
   an adhesive layer formed on the main surface of the substrate, the adhesive layer containing a metal oxide as a main component;
   a first conductive layer formed on the adhesive layer;
   an anchor portion formed on the adhesive layer, the anchor portion embedded in the first conductive layer, the anchor portion containing glass as a main component; and
   a second conductive layer disposed opposite to the first conductive layer with the substrate located in-between.

2. The piezoelectric/electrostrictive element according to claim 1, wherein
   the metal oxide contained in the adhesive layer includes at least one of bismuth oxide, lead oxide and vanadium oxide.

3. The piezoelectric/electrostrictive element according to claim 1, wherein
   the glass contained in the anchor portion includes silicon oxide and boron oxide.

4. The piezoelectric/electrostrictive element according to claim 3, wherein a weight concentration ratio of silicon to boron in the anchor portion is at least 2.5.

5. The piezoelectric/electrostrictive element according to claim 1, wherein
the anchor portion is positioned at a triple junction of a crystal grain of the conductive layer.

6. The piezoelectric/electrostrictive element according to claim 1, wherein
the ceramic contained in the substrate is lead-based piezoelectric ceramic.

7. The piezoelectric/electrostrictive element according to claim 1, wherein
the conductive layer contains at least one of gold, silver, copper and platinum as a main component.

8. A wiring substrate comprising,
a substrate containing ceramic as a main component, the substrate having a main surface;
an adhesive layer formed on the main surface of the substrate, the adhesive layer containing a metal oxide as a main component;
a conductive layer formed on the adhesive layer; and
an anchor portion formed on the adhesive layer, the anchor portion embedded in the conductive layer, the anchor portion containing glass as a main component.

* * * * *